(12) United States Patent (10) Patent No.: US 7,630,274 B2
Kim (45) Date of Patent: Dec. 8, 2009

(54) CIRCUIT AND METHOD FOR SELECTING WORD LINE OF SEMICONDUCTOR MEMORY APPARATUS

(75) Inventor: Mi-Hye Kim, Gyeonggi-do (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 71 days.

(21) Appl. No.: 11/826,400

(22) Filed: Jul. 16, 2007

(65) Prior Publication Data

US 2008/0137469 A1 Jun. 12, 2008

(30) Foreign Application Priority Data

Dec. 7, 2006 (KR) ...................... 10-2006-0124052

(51) Int. Cl.
G11C 11/34 (2006.01)
(52) U.S. Cl. .................................. 365/230.06; 365/222
(58) Field of Classification Search ............ 365/230.06, 365/222
See application file for complete search history.

(56) References Cited

U.S. PATENT DOCUMENTS

| 6,061,278 | A  | * | 5/2000 | Kato et al. ................... 365/190 |
| 6,219,298 | B1 |   | 4/2001 | Hur et al. |
| 6,233,183 | B1 |   | 5/2001 | Kim et al. |
| 6,243,319 | B1 |   | 6/2001 | Yokozeki |
| 6,256,254 | B1 |   | 7/2001 | Kwak et al. |
| 6,359,828 | B1 |   | 3/2002 | La |
| 6,940,773 | B2 | * | 9/2005 | Poechmueller ............... 365/222 |
| 2003/0033473 | A1 | * | 2/2003 | Blodgett ...................... 711/106 |
| 2004/0196718 | A1 | * | 10/2004 | Poechmueller .............. 365/222 |
| 2005/0265110 | A1 |   | 12/2005 | Kim |

FOREIGN PATENT DOCUMENTS

| JP | 08-306184 | 11/1996 |
| JP | 11195294 | 7/1999 |
| JP | 2000215666 | 8/2000 |
| JP | 2001195886 | 7/2001 |
| KR | 1997-0051187 | 7/1997 |
| KR | 102001005490 | 7/2001 |
| KR | 1020020036085 | 5/2002 |
| KR | 10-0407024 | 3/2004 |

* cited by examiner

*Primary Examiner*—Michael T Tran
(74) *Attorney, Agent, or Firm*—Venable LLP; Jeffri A. Kaminski

(57) ABSTRACT

A word line selecting circuit of a semiconductor memory apparatus having at least two memory areas and a plurality of word lines formed across the two memory areas is provided. The circuit includes: a decoder configured to decode an input address and configured to decode a word line corresponding to the decoded input address from the plurality of word lines; and an address counter configured to count the decoded input address such that the word lines in the memory areas are alternately selected according to a refresh signal.

11 Claims, 6 Drawing Sheets

| A2 | A1 | A0 | ADDRESS / WORD LINE |
|---|---|---|---|
| 0 | 0 | 0 | WL_MA<0> |
| 0 | 0 | 1 | WL_MA<1> |
| 0 | 1 | 0 | WL_MA<2> |
| 0 | 1 | 1 | WL_MA<3> |
| 1 | 0 | 0 | WL_MB<0> |
| 1 | 0 | 1 | WL_MB<1> |
| 1 | 1 | 0 | WL_MB<2> |
| 1 | 1 | 1 | WL_MB<3> |

FIG. 9

| A2 | A1 | A0 | ADDRESS / WORD LINE |
|----|----|----|---------------------|
| 0  | 0  | 0  | WL_MA<0>            |
| 1  | 0  | 0  | WL_MB<0>            |
| 0  | 0  | 1  | WL_MA<1>            |
| 1  | 0  | 1  | WL_MB<1>            |
| 0  | 1  | 0  | WL_MA<2>            |
| 1  | 1  | 0  | WL_MB<2>            |
| 0  | 1  | 1  | WL_MA<3>            |
| 1  | 1  | 1  | WL_MB<3>            |

CIRCUIT AND METHOD FOR SELECTING WORD LINE OF SEMICONDUCTOR MEMORY APPARATUS

CROSS-REFERENCE TO RELATED PATENT APPLICATION

This application claims the benefit of Korean Patent Application No. 10-2006-0124052, filed on Dec. 7, 2006, in the Korean Intellectual Property Office, the disclosure of which is incorporated herein in its entirety by reference.

BACKGROUND OF THE INVENTION

1. Technical Field

The present invention relates to a semiconductor memory apparatus, and more particularly, to a circuit and method for selecting a word line of a semiconductor memory apparatus in a refresh mode.

2. Related Art

In semiconductor memory apparatuses, memory cells for recording data are classified into various units in order to easily control the data.

For example, the memory cells are grouped into banks. The banks are then grouped into mats.

Numerous word lines for recording or reading data on or from the cells are formed in a row direction in the bank.

For example, as shown in FIG. 1, when the banks are divided into a mat A and a mat B, the word lines are divided into word lines WL_MA<0:N> corresponding to the mat A and word lines WL_MB<0:N> corresponding to the mat B.

In a dynamic random access memory (DRAM), which is the most popular non-volatile memory, data loss occurs in the cells having data recorded thereon after a predetermined time has elapsed. Therefore, the semiconductor memory apparatus should perform a refresh operation for recording data recorded on the cells at the original data level again in order to prevent the cell data loss. The refresh operation is divided into two main refresh operations, that is, a self refresh operation in which the semiconductor memory apparatus performs a refresh operation at a predetermined time interval, and an auto refresh operation in which the semiconductor memory apparatus performs a refresh operation according to a refresh command input from the outside.

Before the refresh operation, an operation for selecting the word lines in a predetermined order should be performed. When the word line is selected, a refresh operation is performed on the cell connected to the selected word line. The semiconductor memory apparatus is provided with a word line selecting circuit for selecting the word line.

Next, the word line selecting circuit of the semiconductor memory apparatus according to the related art will be described below.

As shown in FIG. 2, the word line selecting circuit of the semiconductor memory apparatus according to the related art includes: a decoder 20 that decodes an input address A<0:n> and selects a word line corresponding to the decoded results from a plurality of word lines WL_MA<0:N> and WL_MB<0:N>; and an address counter 10 that counts the address A<0:n> using a refresh pulse REFP. The refresh pulse is generated in a refresh period according to a self refresh command or an auto refresh command.

As shown in FIG. 3, the address counter 10 includes a plurality of counters CNT0 to CNTn that are connected in series to each other to count the address A<0:n>. A self refresh signal SREF in addition to an output signal of a previous counter is input to the counter CNTn for counting the most significant bit address An.

The counter CNT0 receives the refresh pulse REFP and counts an address A0, and each of the counters CNT1 to CNTn receives an output signal of a previous counter and counts the corresponding address A<1:n>.

In the self refresh operation, two word lines of the mats A and B shown in FIG. 1 are simultaneously selected in order to reduce current consumption, and the cells connected to the selected word lines are refreshed. In this case, the counter CNT1 to CNTn−1 operates normally to count the address A<0:n−1>, and then output the counted address. The output of the counter CNTn is cut off by the self refresh signal SREF. A separate structure (not shown) generates the most significant address An to be output from the counter CNTn and simultaneously selects two word lines of the mats A and B.

Meanwhile, in the auto refresh operation, the word line of the mat A and the word line of the mat B shown in FIG. 1 are sequentially selected, and the cells connected to the selected word lines are refreshed. For example, assuming that word lines WL_MA<0:3> and WL_MB<0:3> are provided and addresses for selecting the word lines are A<0:2>, as shown in FIG. 4, the address A<0:2> increases in the order of 000, 001, 100, 101, 010, 011, 110, and 111, and the word lines WL_MA<0>, WL_MB<0>, WL_MA<1>, WL_MB<1>, WL_MA<2>, WL_MB<2>, WL_MA<3>, and WL_MB<3> are selected.

However, the word line selecting circuit of the semiconductor memory apparatus according to the related art sequentially selects word lines and performs refresh during the auto refresh operation, which may cause cell data loss. For example, according to the self refresh operation, when an auto refresh command is input immediately after pairs of word lines WL_MA<0> and WL_MB<0>, WL_MA<1> and WL_MB<1>, and WL_MA<2> and WL_MB<2> shown in FIG. 1 are selected and then refresh is performed, the word lines are selected in the order of WL_MA<3>, WL_MA<4>, WL_MA<5>, . . . , WL_MA<N>, WL_MB<1>, WL_MB<2>, . . . , WL_MB<N>, and then refresh is performed. Therefore, the word lines after the word line WL_MB<2> are refreshed at a time later than that at which the other word lines are refreshed, which may cause cell data loss.

SUMMARY OF THE INVENTION

An embodiment of the present invention provides a circuit and method for selecting a word line of a semiconductor memory apparatus capable of preventing data loss.

According to an embodiment of the invention, there is provided a word line selecting circuit of a semiconductor memory apparatus having at least two memory areas and a plurality of word lines formed across the two memory areas. The circuit includes: a decoder that decodes an input address and selects the word line corresponding to the decoded results from the plurality of word lines; and an address counter that counts the address such that the word lines in the memory areas are alternately selected according to a refresh signal.

According to another embodiment of the invention, there is provided a method of selecting a word line in a semiconductor memory apparatus having at least two memory areas and a plurality of word lines formed across the two memory areas. The method includes: counting an address such that the word lines in the memory areas are alternately selected according to a refresh signal; and decoding the counted address and selecting the word line corresponding to the decoded results from the plurality of word lines.

BRIEF DESCRIPTION OF THE DRAWINGS

FIG. 9 is an address/word line table according to an embodiment of the invention.

DESCRIPTION OF EXEMPLARY EMBODIMENT

Embodiments of a method and circuit for selecting a word line of a semiconductor memory apparatus according to the present invention will now be described in detail with reference to the accompanying drawings.

Figure 1:
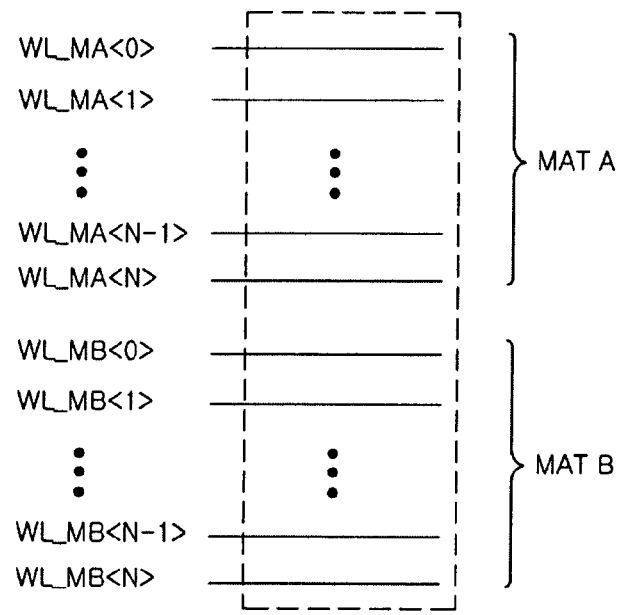
FIG. 1 is a diagram illustrating the arrangement of word lines in a semiconductor memory apparatus according to the related art.
Figure 2:
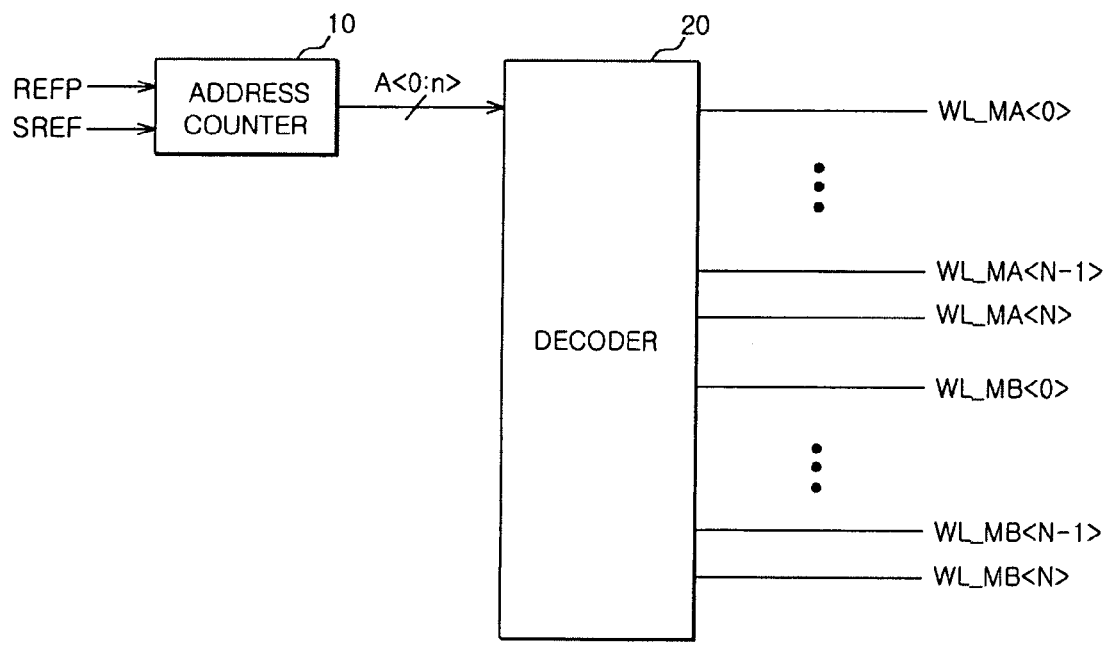
FIG. 2 is a block diagram illustrating a word line selecting circuit of the semiconductor memory apparatus according to the related art.
Figures 3, 4:
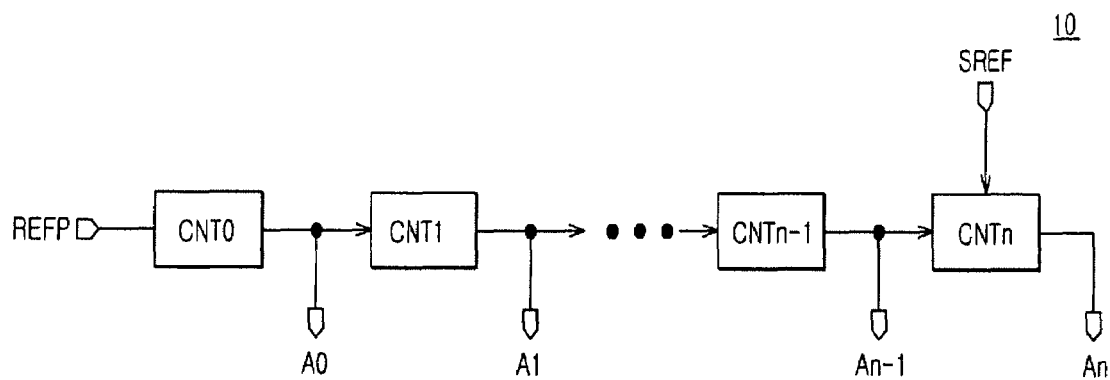
FIG. 3 is a block diagram illustrating an address counter shown in FIG. 2.
FIG. 4 is an address/word line table according to the related art.
Figure 5:
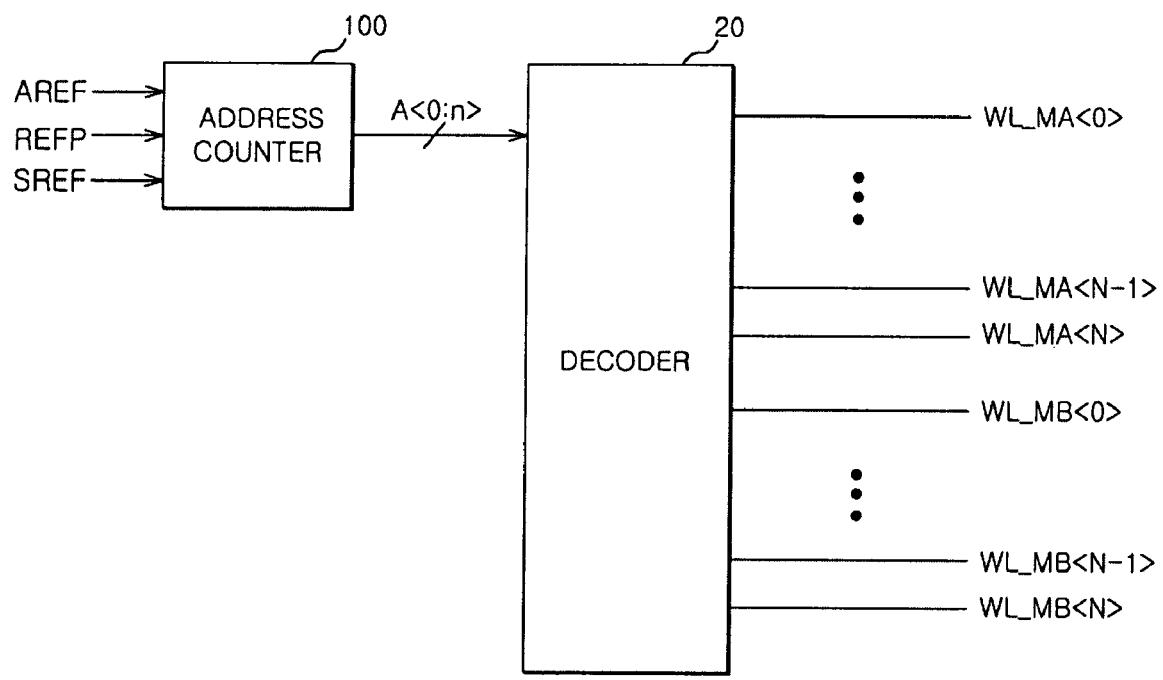
FIG. 5 is a block diagram illustrating a word line selecting circuit of a semiconductor memory apparatus according to an embodiment of the invention.

As shown in FIG. 5, a word line selecting circuit of a semiconductor memory apparatus according to an embodiment of the invention includes: a decoder 20 that decodes an input address A<0:n> and selects one of a plurality of word lines WL_MA<0:N> on the basis of the decoded result; and an address counter 100 that counts the address A<0:n> such that a word line WL_MA<0:N> corresponding to a mat A and a word line WL_MA<0:N> corresponding to a mat B in FIG. 1 are alternatively selected according to an auto refresh signal AREF, a refresh pulse REFP, and a self refresh signal SREF.

Figure 6:
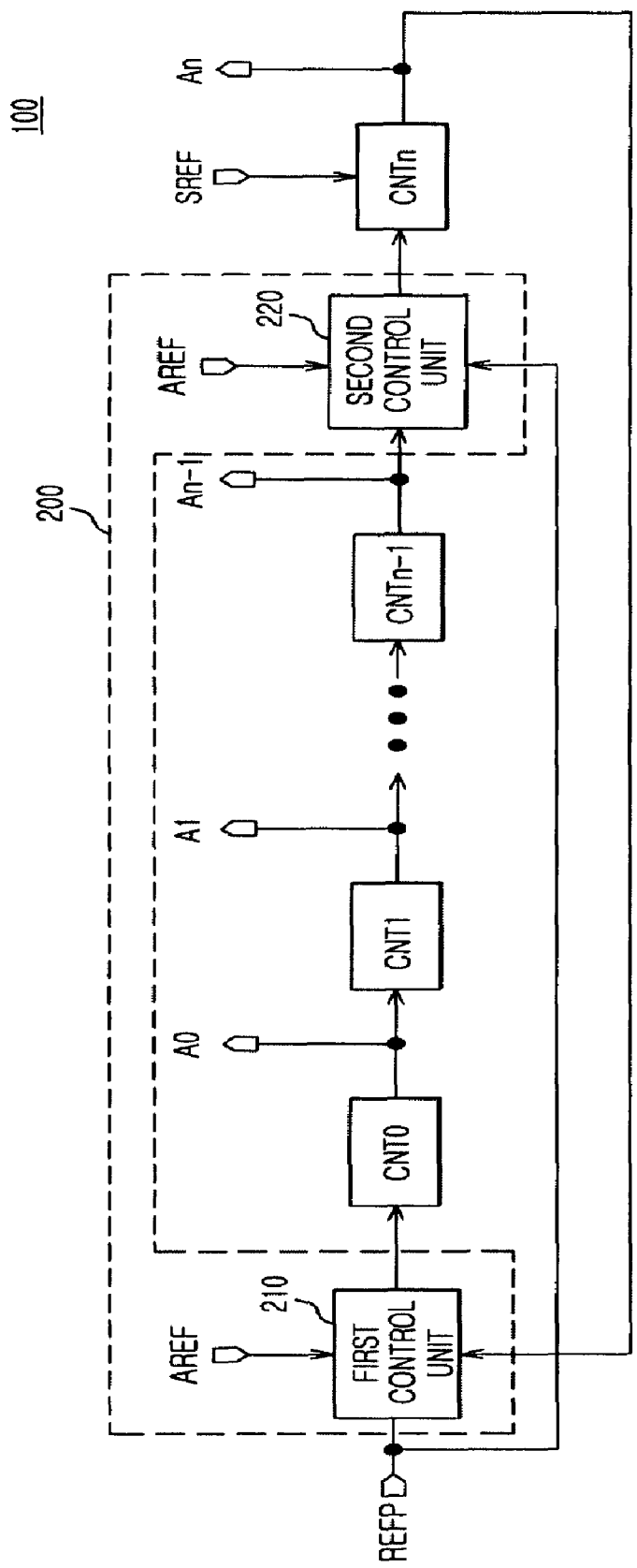
FIG. 6 is a block diagram illustrating an address counter shown in FIG. 5.

As shown in FIG. 6, the address counter 100 includes a plurality of counters CNT0 to CNTn that are connected in series to each other and count the address A<0:n> and a control unit 200 that controls the input paths of the counters CNT0 and CNTn among the plurality of counters CNT0 to CNTn according to the auto refresh signal AREF.

The control unit 200 includes: a first control unit 210 that inputs the output of the counter CNTn for counting the most significant bit An of the address among the plurality of counters CNT0 to CNTn to the counter CNT0 for counting the least significant bit A0 of the address among the plurality of counters CNT0 to CNTn according to the auto refresh signal AREF; and a second control unit 220 that inputs the refresh pulse REFP to the counter CNTn for counting the most significant bit An of the address according to the auto refresh signal AREF. The refresh pulse REFP is generated in a refresh pulse according to a self refresh command or an auto refresh command.

Figure 7:
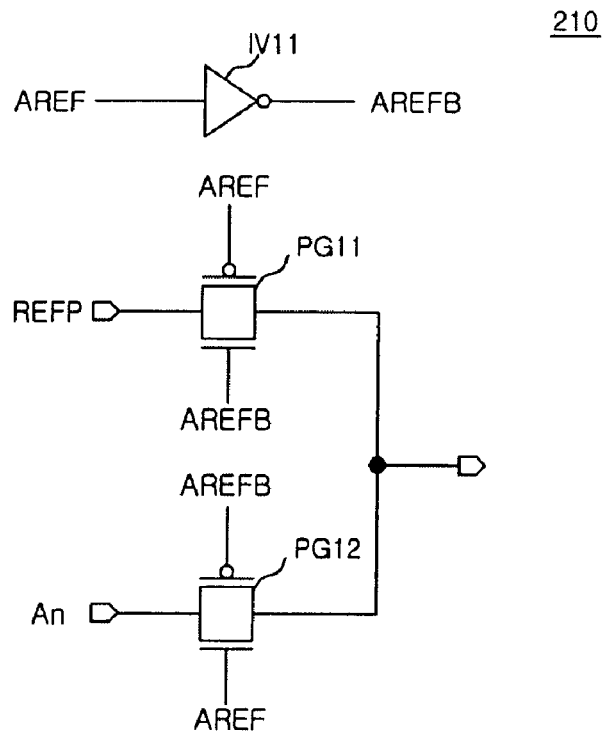
FIG. 7 is a circuit diagram illustrating a first control unit shown in FIG. 6.

As shown in FIG. 7, the first control unit 210 includes: an inverter IV11 that receives the auto refresh signal AREF and outputs an inverted auto refresh signal AREFB; a first pass gate PG11 that passes the refresh pulse REFP according to the auto refresh signal AREF and the inverted auto refresh signal AREFB; and a second pass gate PG12 that passes the most significant bit An of the address according to the auto refresh signal AREF and the inverted auto refresh signal AREFB.

Figure 8:
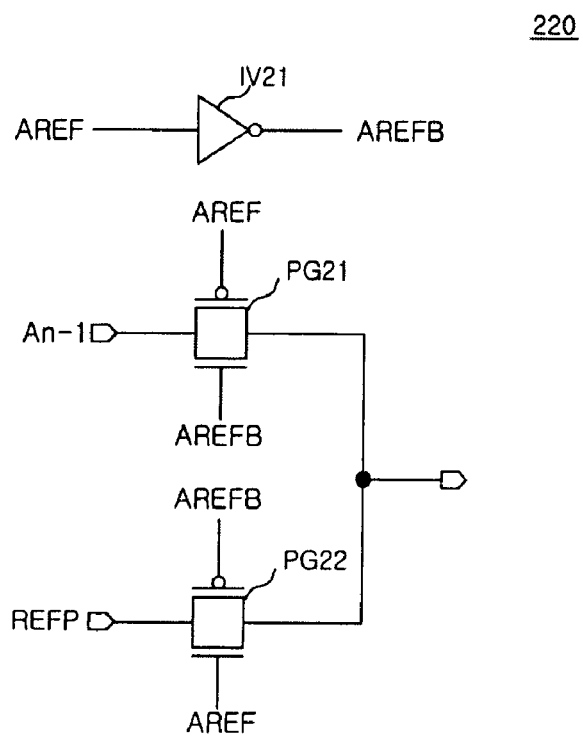
FIG. 8 is a circuit diagram illustrating a second control unit shown in FIG. 6.

As shown in FIG. 8, the second control unit 220 includes: an inverter IV21 that receives the auto refresh signal AREF and outputs an inverted auto refresh signal AREFB; a first pass gate PG21 that passes the address An−1 according to the auto refresh signal AREF and the inverted auto refresh signal AREFB; and a second pass gate PG22 that passes the refresh pulse REFP according to the auto refresh signal AREF and the inverted auto refresh signal AREFB.

Next, the operation of the word line selecting circuit of the semiconductor memory apparatus according to an embodiment of the invention will be described.

In a self refresh mode, the auto refresh signal AREF is inactivated at a low level.

Since the auto refresh signal AREF is at the low level, the first pass gate PG11 is turned on in the first control unit 210 of the address counter 100 shown in FIG. 7, and the refresh pulse REFP is input to the counter CNT0 shown in FIG. 6.

Since the auto refresh signal AREF is at the low level, the first pass gate PG21 is turned on in the second control unit 220 shown in FIG. 8, and the address An−1 is input to the counter CNTn.

Therefore, the counter CNT0 of the address counter 100 receives the refresh pulse REFP and counts the address A0, and each of the counters CNT1 to CNTn receives the output of the previous counter and counts the corresponding address A<1:n>.

Meanwhile, in an auto refresh mode, the auto refresh signal AREF is activated at a high level.

Since the auto refresh signal AREF is at the high level, the second pass gate PG12 is turned on in the first control unit 210 of the address counter 100 shown in FIG. 7, and the most significant address An is input to the counter CNT0 shown in FIG. 6.

Since the auto refresh signal AREF is at the high level, the second pass gate PG22 is turned on in the second control unit 220 shown in FIG. 8, and the refresh pulse REFP is input to the counter CNTn.

Therefore, the counter CNTn of the address counter 100 receives the refresh pulse REFP and counts the most significant address An, and the counter CNT0 receives the most significant address An and counts the least significant address A0.

Each of the counters CNT1 to CNTn−1 receives the output of the previous counter and counts the corresponding address A<1:n−1>.

For example, assuming that word lines WL_MA<0:3> and WL_MB<0:3> are provided and addresses for selecting the word lines are A<0:2>, the address A<0:2> increases in the order of 000, 001, 100, 101, 010, 011, 110, and 111, and the word lines of the mat A and the word lines of the mat B are alternately selected in the order of WL_MA<0>, WL_MB<0>, WL_MA<1>, WL_MB<1>, WL_MA<2>, WL_MB<2>, WL_MA<3>, and WL_MB<3>.

In the self refresh mode, when the auto refresh command is input immediately after the word lines WL_MA<0>, WL_MB<0>, WL_MA<1>, WL_MB<1>, WL_MA<2>, and WL_MB<2> are sequentially selected and refresh is performed, the word lines WL_MA<3>, WL_MB<3>, WL_MA<4>, WL_MB<4>, . . . , WL_MA<N>, and WL_MB<N> are selected in this order, and refreshis performed. Therefore, the word lines after the word line WL_MB<2> are periodically refreshed regardless of the refresh mode, which prevents the loss of cell data.

It will be apparent to those skilled in the art that various modifications and changes may be made without departing from the scope and spirit of the present invention. Therefore, it should be understood that the above embodiments are not limitative, but illustrative in all aspects. The scope of the present invention is defined by the appended claims rather than by the description preceding them, and therefore all changes and modifications that fall within metes and bounds of the claims, or equivalents of such metes and bounds are therefore intended to be embraced by the claims.

In the method and circuit for selecting a word line of a semiconductor memory apparatus according to embodiments of the invention, the word lines of different mats may be alternately selected in the auto refresh mode. Therefore, it is possible to prevent a specific word line from being selected late due to self refresh and thus prevent the loss of cell data, which makes it possible to improve the reliability of data.

What is claimed is:

1. A word line selecting circuit of a semiconductor memory apparatus having at least two memory areas and a plurality of word lines formed on the memory areas, the circuit comprising:
   a decoder configured to decode an input address to obtain a decoded input address and to select a word line corresponding to the decoded input address from the plurality of word lines; and
   an address counter configured to count the input address such that the word lines are selected on alternate the memory areas according to a refresh signal,
   wherein the address counter comprises;
   a plurality of counters that are connected in series to each other and are configured to count the input address; and
   a control unit configured to control input paths of some of the plurality of counters based on the refresh signal.

2. The word line selecting circuit of claim 1,
   wherein the input signal of a counter among the plurality of counters for counting a most significant bit and a least significant bit of the input address is determined by the control unit.

3. The word line selecting circuit of claim 1,
   wherein the control unit comprises:
   a first control unit configured to input an output of a most significant bit counter among the plurality of counters to a least significant bit counter among the plurality of counters according to the refresh signal; and
   a second control unit configured to input a pulse signal generated to correspond to a refresh operation period to the most significant bit counter among the plurality of counters according to the refresh signal.

4. The word line selecting circuit of claim 3,
   wherein the first control unit comprises:
   a first switching element that passes the pulse signal generated to correspond to the refresh operation period according to the refresh signal; and
   a second switching element configured to pass the output of the counter for counting the most significant bit of the address according to the refresh signal.

5. The word line selecting circuit of claim 4,
   wherein the first and second switching elements comprise pass gates.

6. The word line selecting circuit of claim 4,
   wherein the refresh signal is generated according to a refresh command that is input from outside of the semiconductor memory apparatus.

7. The word line selecting circuit of claim 3,
   wherein the second control unit comprises:
   a first switching element configured to pass an output of a counter among the plurality of counters for counting a previous bit of the most significant bit of the input address according to the refresh signal; and
   a second switching element configured to pass the pulse signal generated to correspond to the refresh operation period according to the refresh signal.

8. The word line selecting circuit of claim 7,
   wherein the first and second switching elements comprise pass gates.

9. The word line selecting circuit of claim 7,
   wherein the refresh signal is generated according to a refresh command that is input from outside of the semiconductor memory apparatus.

10. A method of selecting a word line in a semiconductor memory apparatus having at least two memory areas and a plurality of word lines formed on the memory areas, the method comprising:
    counting an address to obtain a counted address such that the word lines are selected on alternate the memory areas according to a refresh signal; and
    decoding the counted address to obtain a decoded counted address and selecting a word line corresponding to the decoded counted address from the plurality of word lines,
    wherein the counting of the address comprises:
    counting a most significant bit by using a signal used to count a least significant bit of the address; and
    counting the least significant bit using the most significant bit.

11. The method of claim 10,
    wherein the signal used to count the least significant bit of the address is a pulse signal generated to correspond to a refresh operation period.

* * * * *